US006456189B1

(12) United States Patent
Mosesian et al.

(10) Patent No.: US 6,456,189 B1
(45) Date of Patent: Sep. 24, 2002

(54) ELECTRICAL FUSE WITH INDICATOR

(75) Inventors: Jerry L. Mosesian, Newburyport, MA (US); Robert Wilkins, Wirral Mersey Side (GB)

(73) Assignee: Ferraz Shawmut Inc., Newburyport, MA (US)

( * ) Notice: Subject to any disclaimer, the term of this patent is extended or adjusted under 35 U.S.C. 154(b) by 43 days.

(21) Appl. No.: 09/724,154

(22) Filed: Nov. 28, 2000

(51) Int. Cl.[7] ........................ H01H 85/30; G01R 31/07

(52) U.S. Cl. ....................... 337/243; 337/241; 337/265; 337/266; 337/206; 116/207; 324/550

(58) Field of Search ................................ 337/241, 242, 337/245, 265, 206, 266; 439/490, 491, 622; 324/537, 507, 550, 691; 340/638, 639; 361/835; 81/3, 8; 116/206, 202, 207

(56) References Cited

U.S. PATENT DOCUMENTS

| | | | | | |
|---|---|---|---|---|---|
| 737,280 | A | * | 8/1903 | Sachs | 337/243 |
| 737,281 | A | * | 8/1903 | Sachs | 337/243 |
| 737,368 | A | * | 8/1903 | Downes | 337/243 |
| 737,369 | A | * | 8/1903 | Downes | 337/243 |
| 792,530 | A | * | 6/1905 | Marshall | 337/243 |
| 809,978 | A | * | 1/1906 | Ogle | 337/243 |
| 821,873 | A | | 5/1906 | Hoffmann | |
| 1,014,741 | A | * | 1/1912 | Barringer et al. | 337/243 |
| 1,040,150 | A | * | 10/1912 | Cole | 337/243 |
| 1,087,120 | A | * | 2/1914 | Hooker | 337/243 |
| 1,793,103 | A | | 11/1929 | La Mar | |
| 1,246,417 | A | | 2/1931 | Gilbert | |
| 2,164,658 | A | | 7/1939 | Lyon | 200/121 |
| 2,175,250 | A | * | 10/1939 | Burrows et al. | 252/408.1 |
| 3,182,153 | A | | 5/1965 | Postal | 200/121 |
| 3,336,452 | A | | 8/1967 | Baker | 200/121 |
| 3,396,335 | A | | 8/1968 | Burr et al. | 324/51 |
| 3,513,427 | A | | 5/1970 | Prosser et al. | 337/243 |
| 3,814,139 | A | | 6/1974 | Loyd et al. | 138/141 |
| 3,863,191 | A | | 1/1975 | Salzer | 337/244 |
| 3,997,862 | A | | 12/1976 | Kozacka et al. | 337/241 |
| 4,142,151 | A | | 2/1979 | Hansen | 324/158 |
| 4,308,516 | A | | 12/1981 | Shimada et al. | 337/241 |
| 4,401,356 | A | | 8/1983 | Bare | 339/258 R |
| 4,641,120 | A | | 2/1987 | Bonfig et al. | 337/242 |
| 4,760,367 | A | | 7/1988 | Williams | 337/241 |
| 4,835,476 | A | | 5/1989 | Kurosawa | 324/435 |

(List continued on next page.)

FOREIGN PATENT DOCUMENTS

| | | | | | |
|---|---|---|---|---|---|
| DE | 3332839 | A1 * | 8/1984 | H01H/85/30 |
| EP | 213404 | A1 * | 3/1987 | H01H/85/30 |
| SU | 666-595 | | 6/1979 | |

*Primary Examiner*—Anatoly Vortman
(74) *Attorney, Agent, or Firm*—Mark Kusner; Michael A. Jaffe

(57) ABSTRACT

An electric fuse is comprised of a tubular fuse casing formed of an electrically insulating material. A first conductive component is attached to a first end of the casing and a second conductive component is attached to a second end of the casing. A first conductive path is formed through the tube between the first and second conductive components. The conductive path includes a fusible element having a first resistance. A second conductive path is formed along the exterior of the tubular fuse casing. The second conductive path is in parallel to the first conductive path and has a second resistance greater than the first resistance. The second conductive path includes an indicator component. The indicator component is comprised of first layer comprised of a colored material, and a second layer comprised of an electrically conductive material deposited onto the first layer. The second layer has a region of increased resistance. An inner cavity is located above the region of increased resistance on the second layer. A third layer comprised of a transparent, polymeric material covers the cavity and the first and second layers.

15 Claims, 9 Drawing Sheets

U.S. PATENT DOCUMENTS

| | | | | |
|---|---|---|---|---|
| 4,873,506 | A | 10/1989 | Gurevich | 337/290 |
| 4,906,963 | A | 3/1990 | Ackermann et al. | 337/244 |
| 5,196,819 | A | 3/1993 | Roberts | 337/297 |
| 5,225,473 | A | 7/1993 | Duan | 524/388 |
| 5,481,239 | A | 1/1996 | Di Troia | 337/206 |
| 5,525,181 | A | 6/1996 | Bruckner et al. | 156/298 |
| 5,604,049 | A | 2/1997 | Weiss et al. | 429/93 |
| 5,606,301 | A | 2/1997 | Ishimura | 337/290 |
| 5,612,151 | A | 3/1997 | Hughen | 429/93 |
| 5,644,282 | A | 7/1997 | Mehta et al. | 337/295 |
| 5,673,028 | A | 9/1997 | Levy | 340/635 |
| 5,776,371 | A | 7/1998 | Parker | 252/502 |
| 5,800,724 | A | 9/1998 | Habeger et al. | 216/35 |
| 5,821,849 | A | 10/1998 | Dietsch et al. | 337/241 |
| 5,894,048 | A | 4/1999 | Eckart et al. | 428/339 |
| 5,936,508 | A | 8/1999 | Parker | 337/241 |
| 5,994,993 | A | 11/1999 | Castonguay et al. | 337/206 |
| 6,292,087 | B1 * | 9/2001 | Castonguay et al. | 337/206 |

* cited by examiner

ELECTRICAL FUSE WITH INDICATOR

FIELD OF THE INVENTION

The present invention relates generally to electrical fuses, and more particularly to an electric fuse having an indicator for indicating whether the fuse has become non-conducting, i.e., "blown."

BACKGROUND OF THE INVENTION

An electric fuse is designed to allow temporary and harmless current to pass therethrough without triggering, i.e., opening the fuse. The fuse is nevertheless operable to open if subjected to sustained overloads or excessive short circuit conditions. In many instances, an "open," i.e., a "blown," fuse will exhibit no visible signs of its condition.

The present invention relates to an improved electric fuse having an indicator for indicating whether the fuse has become non-conducting, i.e., "blown."

SUMMARY OF THE INVENTION

In accordance with a preferred embodiment of the present invention, there is provided an electric fuse comprised of a tubular fuse casing formed of an electrically insulating material. A first conductive component is attached to a first end of the casing and a second conductive component is attached to a second end of the casing. A first conductive path is formed through the tube between the first and second conductive components. The conductive path includes a fusible element having a first resistance. A second conductive path is formed along the exterior of the tubular fuse casing. The second conductive path is in parallel to the first conductive path and has a second resistance greater than the first resistance. The second conductive path includes an indicator component. The indicator component is comprised of first layer comprised of a deep-dyed color material, and a second layer comprised of a conductive material deposited onto the first layer. The second layer has a region of increased resistance. An inner cavity is located above the region of increased resistance on the second layer. A third layer comprised of a transparent, polymeric material covers the cavity and the first and second layers.

In accordance with another aspect of the present invention, there is provided an electric fuse, comprised of a tubular fuse casing formed of an electrically insulating material having a first conductive component attached to a first end of the casing and a second conductive component attached to a second end of the casing. A first conductive path is formed through the tube between the first and second conductive components. The first conductive path includes a fusible element and has a first resistance. An indicator strip extends along the length of the tubular fuse casing. The indicator strip is comprised of a first layer of a colored polymer having a layer of metal deposited thereon. The metal layer is electrically connected to the first and second conductive components to be in parallel with the first conductive path. The metal layer has a resistance greater than the first conductive path and a region of reduced cross-sectional area wherein the resistance of the metal layer in the region of the reduced cross-sectional area is greater than a remainder of the metal layer. A cover layer of polymeric material covers the indicator strip. The cover layer is clear in the vicinity of the region of reduced cross-sectional area, wherein the region is visible through the cover layer. A cavity is formed between the cover layer and the metal layer. The cavity is disposed contiguous to the region of reduced cross-sectional area and is dimensioned to promote vaporization of the metal at the region of reduced cross-sectional area to expose the colored polymer strip when a fault condition exists along the first conductive path.

In accordance with another aspect of the present invention, there is provided an electric fuse, comprised of a tubular casing formed of an electrically insulating material having a first conductive component attached to a first end of the casing and a second conductive component attached to a second end of the casing. A fusible element within the casing is electrically connected to the first and second conductive components. The first fusible element has a first resistance. An indicator is provided on the casing. The indicator is comprised of a first layer comprised of a non-flammable, dyed material and a second layer comprised of a conductive material deposited on the first layer. The second layer has an area of reduced thickness and a predetermined resistance greater than the resistance of the fusible element. The indicator is mounted to the casing with the second layer electrically connected to the first and second conductive elements in parallel with the fusible element and with the first layer of dyed material between the second layer and the casing. A third layer of a clear, polymeric material covering the indicator and at least a portion of the casing wherein the area of reduced thickness of the second layer is visible through the third layer. The second layer of conductive material is dimensioned to vaporize and expose a portion of the first layer when the fusible element experiences a fault condition that eliminates the electrical connection between the first and second conductive elements. The indicator provides a first visual indication when the fault condition results from a short circuit and a second visual indication when the fault condition results from an over current fault condition.

It is an object of the present invention to provide an electric fuse having an indicator for indicating whether the fuse has become non-conducting or has blown.

Another object of the present invention is to provide an electric fuse as described above that provides an indication whether a non-conducting, i.e., blown, fuse experienced an excessive, short circuit condition or a sustained overload condition.

A still further object of the present invention is to provide an indicator component as described above that is reliable and may be used in most types of electric fuses.

These and other objects will become apparent from the following description of a preferred embodiment of the invention taken together with the accompanying drawings and the appended claims.

BRIEF DESCRIPTION OF THE DRAWINGS

The invention may take physical form in certain parts and arrangement of parts, a preferred embodiment of which will be described in detail in the specification and illustrated in the accompanying drawings which form a part hereof, and wherein.

DETAILED DESCRIPTION OF THE PREFERRED EMBODIMENT

Figure 1:
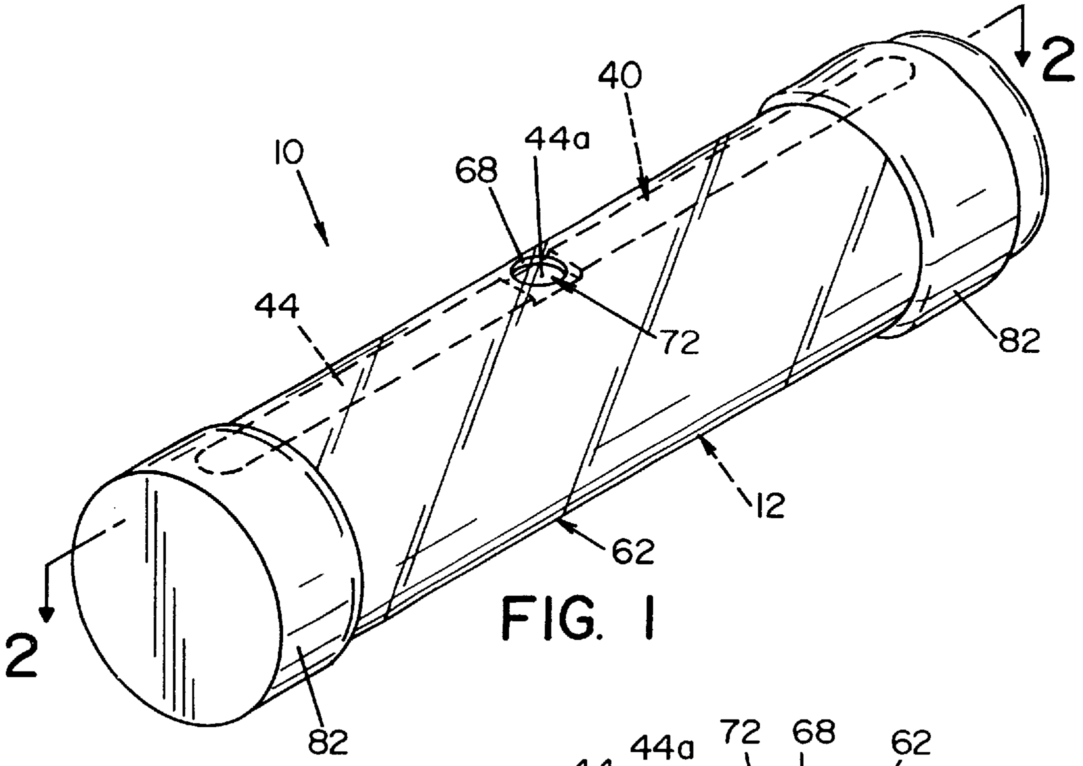
FIG. 1 is a perspective view of an electric fuse having an indicator thereon for indicating the condition of the fuse, illustrating a preferred embodiment of the present invention.

Referring now to the drawings wherein the showings are for the purpose of illustrating preferred embodiments of the invention only, and not for the purpose of limiting same, FIG. 1 shows a fuse 10, illustrating a preferred embodiment of the present invention. Fuse 10 is generally comprised of a tubular, insulated fuse casing 12 that defines an inner bore or cavity 14 that extends axially through fuse casing 12. In the embodiment shown, fuse casing 12 is a cylindrical shape and defines a cylindrical cavity 14.

Figure 2:
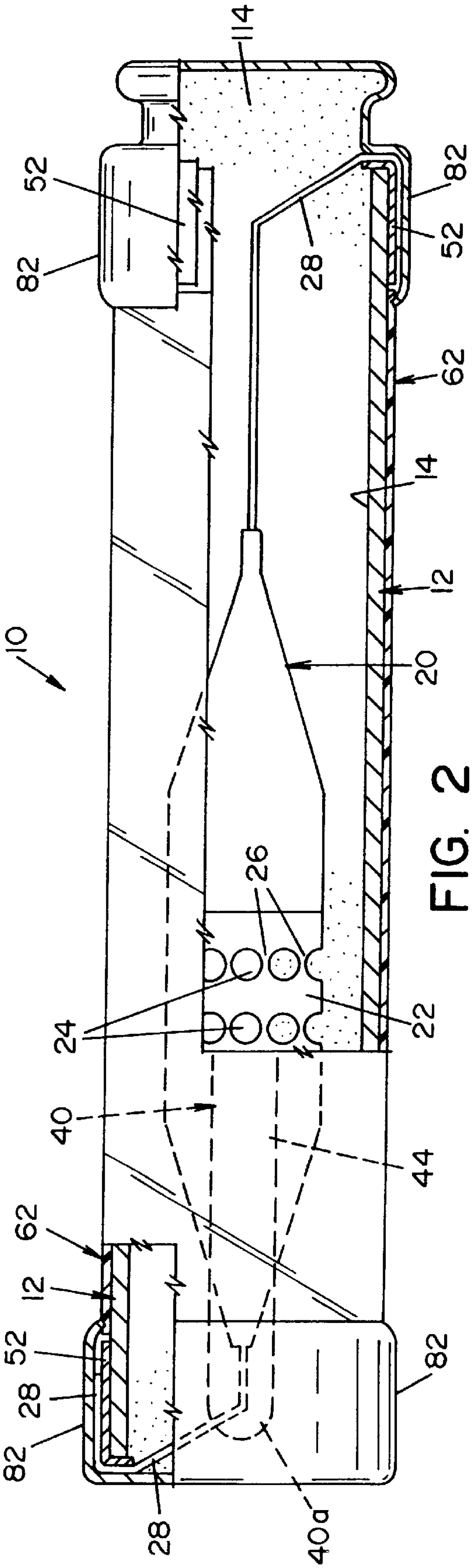
FIG. 2 is an enlarged, partially sectioned, top plan view taken along lines 2—2 of FIG. 1.
Figure 3:
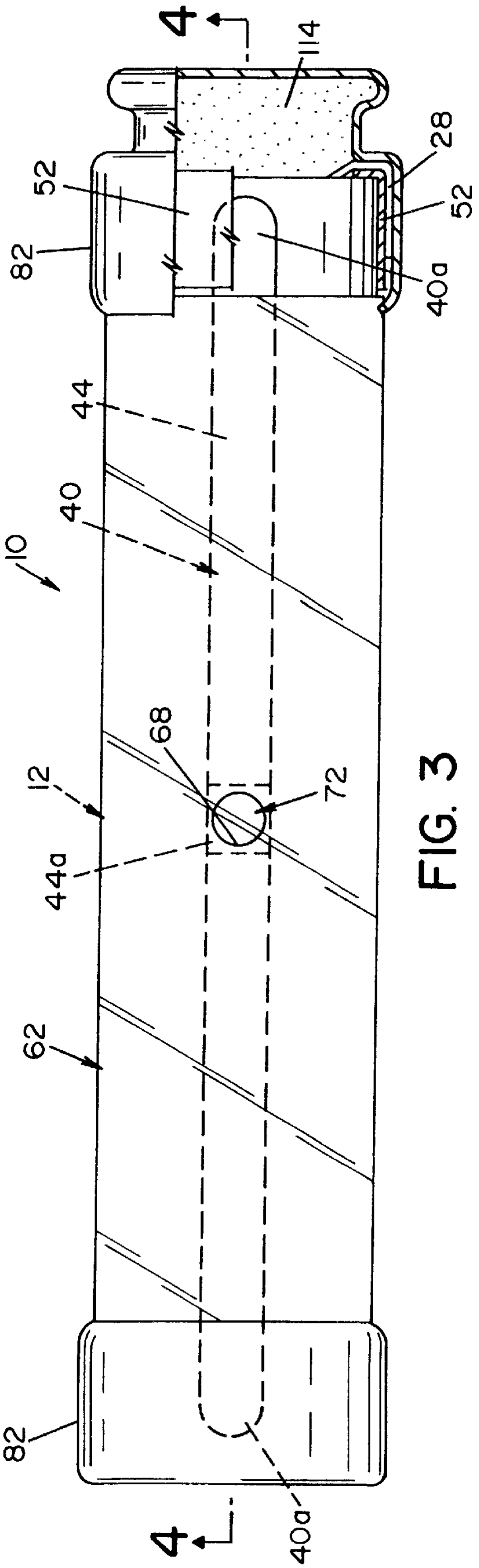
FIG. 3 is a partially sectioned, top plan view of the electrical fuse shown in FIG. 1, showing the indicator portion thereof.

A fusible conductor assembly 20 extends through cavity 14 of fuse casing 12, as best seen in FIG. 2. The fusible conductor assembly 20 in and of itself forms no part of the present invention, and therefore shall not be described in great detail. Basically, fusible conductor assembly 20 is comprised of a conductive element 22 that is formed of a flat strip of conductive material, preferably formed of silver, copper or copper alloys. The dimensions of conductive element 22 determine the Ampere rating of fuse 10. (In this respect, the present invention finds advantageous application for fuses rated from 6 to 6,000 amps). In the embodiment shown, conductive element 22 includes a plurality of aligned apertures 24 that define a plurality of "notched sections" 26 that reduce the cross-section of conductive element 22 and establish the current carrying capacity thereof. Conductive element 22 includes elongated ends or tabs 28 that are adapted to be bent around the ends of fuse casing 12, as best seen in FIGS. 2 and 3. Fusible conductor assembly 20 has a predetermined current carrying capacity and has a specific resistance.

Figure 10:
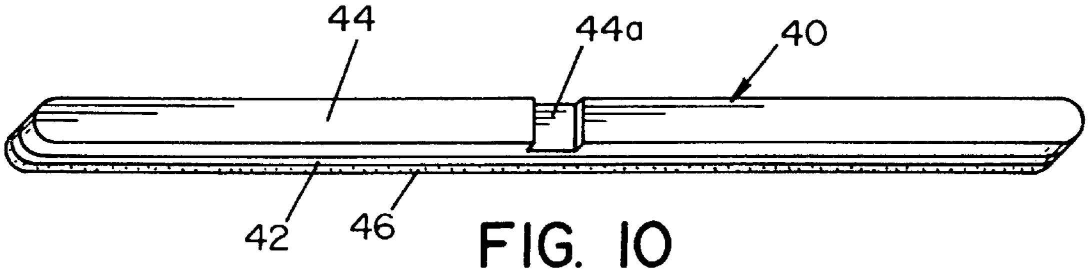
FIG. 10 is a perspective view of an indicator component.
Figure 11:
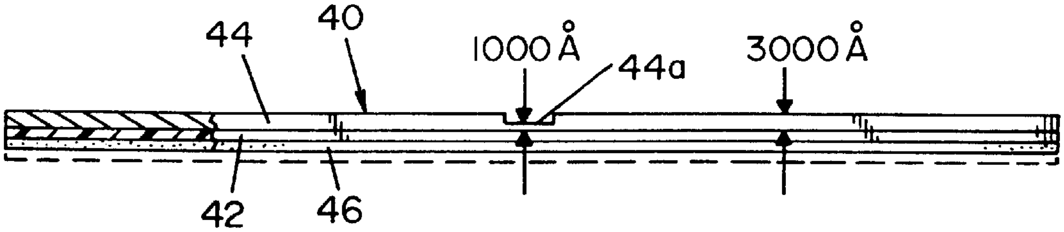
FIG. 11 is a sectional view of the indicator component shown in FIG. 10.

An indicator component 40 is provided along the exterior of fuse casing 12, as best seen in FIGS. 10 and 11. (In the drawings, the thickness of indicator component 40, and the components forming indicator component 40, are exaggerated for the purpose of illustration). In the embodiment shown, indicator component 40 is shaped as a long, narrow strip that extends essentially from one end of fuse casing 12 to the other end.

Indicator component 40, best seen in FIGS. 10 and 11, is basically a layered structure comprised of an indicator layer 42 and an electrically conductive layer 44. Indicator layer 42 may be formed from a variety of non-conductive, non-flammable materials including certain papers and plastics that are treated with a flame retardant material to render them non-flammable. In a preferred embodiment of the present invention, indicator layer 42 is comprised of a polymeric film that is deep-dyed of a bright color. In a preferred embodiment, indicator layer 42 is a red, Mylar® film having a thickness of about 0.002 inches. A clear polymer film having dyed adhesive material therebelow may also find advantageous application in the present invention.

Electrically conductive layer 44 is preferably formed of at least one layer of a metal. Electrically conductive layer 44 may be formed of a variety of different metals, such as, by way of example and not limitation, copper, zinc, aluminum and nichrome. As used herein, the term "conductive layer 44" also includes a multi-layered structure comprised of two or more layers of different metals, such as, for example, a nickel-on-aluminum conductive layer 44 or copper on aluminum conductive layer 44. In the embodiment shown, conductive layer 44 is formed of aluminum. Electrically conductive layer 44 is preferably deposited onto indicator layer 42 by conventional metallization processes, such as vacuum metallization or metal sputtering techniques. In the embodiment shown, electrically conductive layer 44 is vapor deposited onto colored indicator layer 42. The thickness and cross-sectional area of electrically conductive layer 44 is based upon the size of fuse 10. In other words, the cross-sectional area of electrically conductive layer 44 is established such that electrically conductive layer 44 has a specific resistance and current carrying capacity in relation to the resistance and current carrying capacity of fusible conductor assembly 20. Specifically, electrically conductive layer 44 is dimensioned to have a higher resistance than the resistance of fusible conductor assembly 20. In the embodiment shown, for a 30 Ampere fuse, electrically conductive layer 44 basically has a resistance of about 4 ohms (Ω) and a current carrying capacity of about 6 Amperes. Electrically conductive layer 44 preferably has a width of about 0.25 inches, and a thickness of about 3,000 Å.

Electrically conductive layer 44 is designed to have a region 44*a* of increased electrical resistance. In the embodiment shown, region 44*a* has a reduced, cross-sectional area, so as to increase the electrical resistance of electrically conductive layer 44 within region 44*a*. Region 44*a* may be formed by reducing the width, thickness or metallic composition of conductive layer 44 in a direction perpendicular to the direction of current flow. In the embodiment shown, region 44*a* of reduced, cross-sectional area is formed by reducing the thickness of electrically conductive layer 44 along a portion thereof, as best seen in FIG. 11. The reduced thickness in region 44*a* creates a cavity or depression in electrically conductive layer 44, as also seen in FIGS. 10 and 11.

Figure 4:
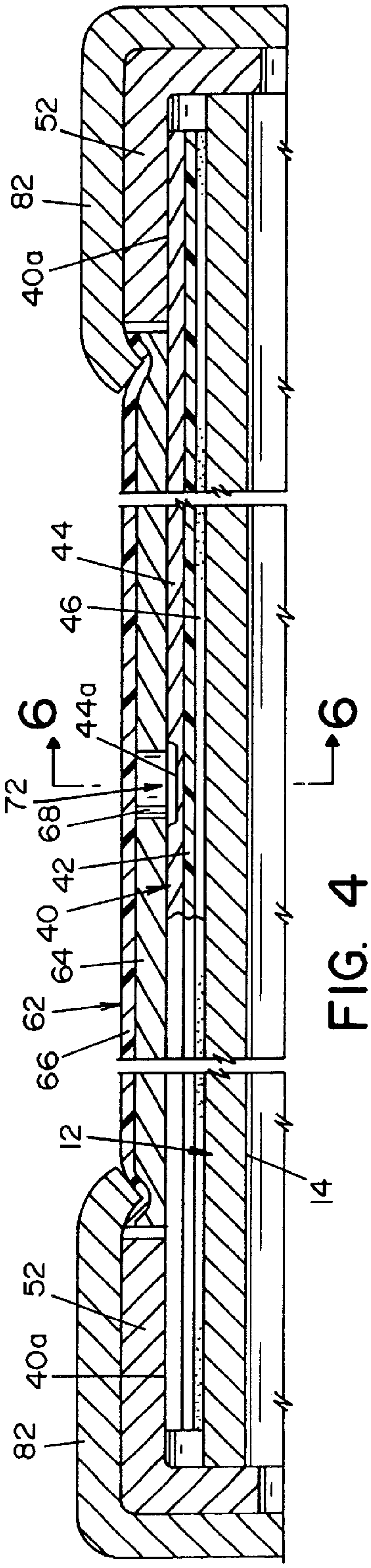
FIG. 4 is a sectional view taken along lines 4—4 of FIG. 3 showing an indicator component according to the present invention in a first state indicative of a conductive, i.e., not blown, fuse.

Indicator component 40 is dimensioned to extend along the outer surface of fuse casing 12. An adhesive layer, designated 46 in the drawings (see for example, FIG. 4) may be used during assembly to mount indicator component 40 to fuse casing 12, as shall be described in greater detail below. Adhesive layer 46 may be any type of adhesive, but is preferably a pressure-sensitive adhesive for easy attachment of indicator component 40 to fuse casing 12. As indicated above, adhesive layer 46 may be dyed to provide color beneath a clear polymer film as part of indicator layer 42.

Inner rings 52, seen in FIGS. 2–5, formed of metal are attached to the distal ends of fuse casing 12. Inner rings 52 are dimensioned to overlay, and be in contact with, a portion of electrically conductive layer 44 (see FIG. 14). Inner rings 52 are rolled, crimped or press fit onto the ends of fuse casing 12 wherein the inner surface of each inner ring 52 is in electrically conductive contact with one end of electrically conductive layer 44 of indicator component 40.

Figure 9:
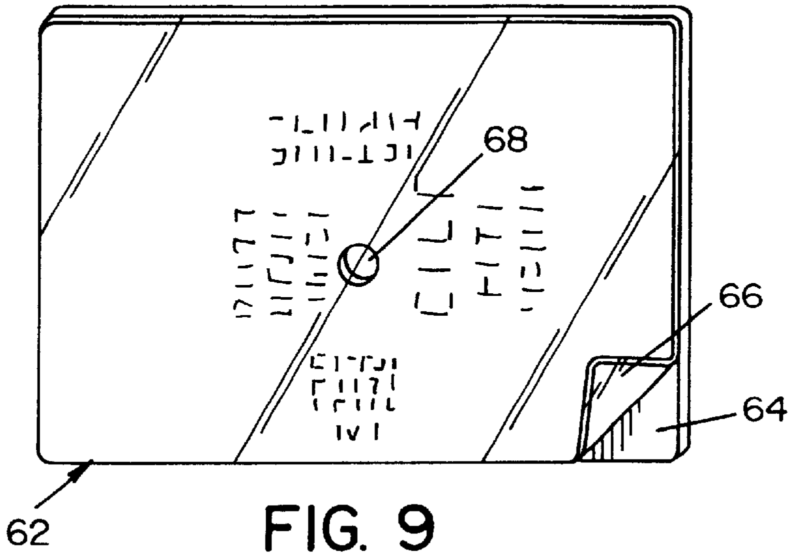
FIG. 9 is a plan view of a laminate casing.

A composite laminate 62 (best seen in FIGS. 6 and 7) covers fuse casing 12 and indicator component 40. Laminate 62 is comprised of an inner layer 64 and an outer layer 66, best seen in FIG. 9. Inner layer 64 may be formed from a variety of non-conductive, non-flammable materials including certain papers and plastics that are treated with a flame retardant material to render them non-flammable. Inner layer 64 preferably has a printable outer surface for labeling to identify the type, class, rating etc. of fuse 10, as schematically illustrated in the drawings. In accordance with the present invention, inner layer 64 includes an opening 68 therethrough. In the embodiment. shown, opening 68 is circular, although other shapes, such as squares, rectangles etc., may be used. The thickness of inner layer 64 is preferably about 2–4 mils.

Outer layer 66 is preferably formed of a clear, non-flammable material, or a non-flammable material that is at least clear in the region of opening 68 in inner layer 64. Outer layer 66 is preferably a clear polymer, such as Mylar®, and has a thickness of approximately 2 mils.

Figure 6:
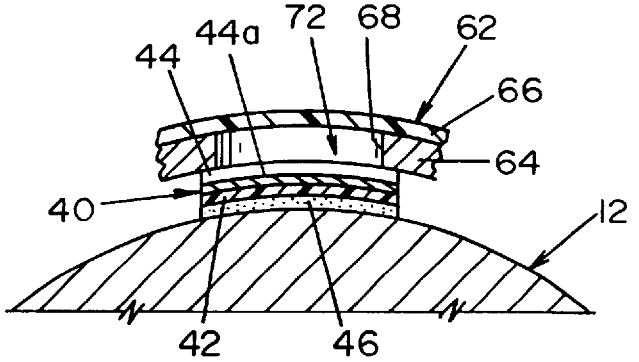
FIG. 6 is an enlarged, sectional view taken along lines 6—6 of FIG. 4.
Figure 7:
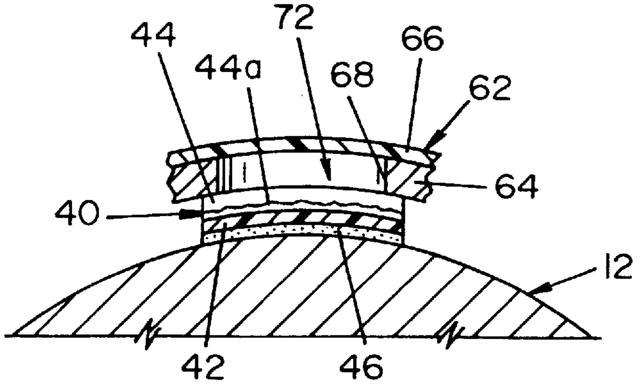
FIG. 7 is an enlarged, sectional view taken along lines 7—7 of FIG. 5.
Figure 5:
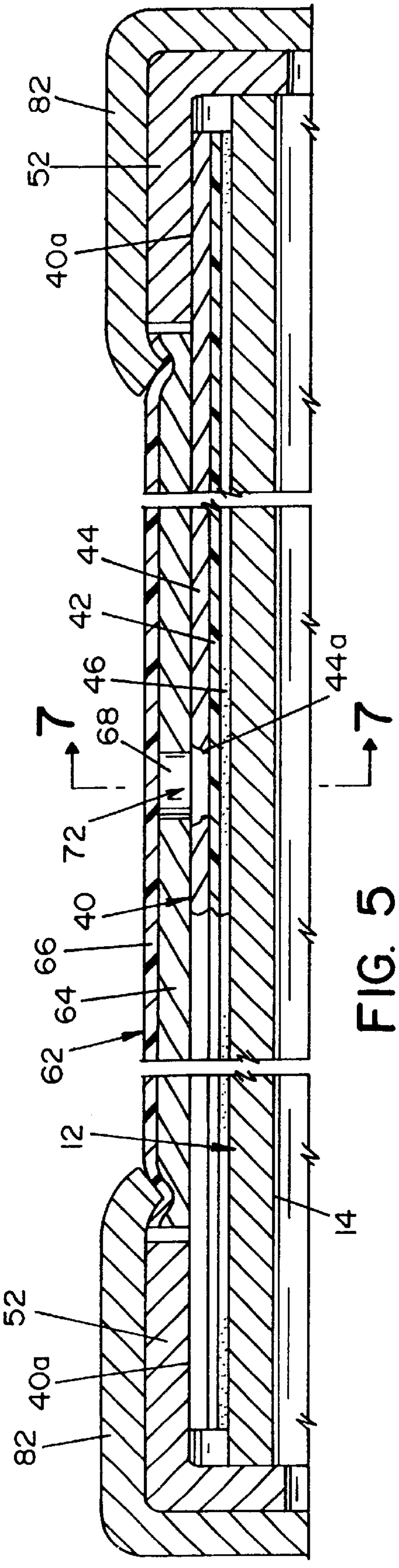
FIG. 5 is a sectional view, similar to FIG. 4, showing an indicator component according to the present invention in a second state indicative of a non-conductive, i.e., blown fuse.

Laminate 62 is dimensioned to encase fuse casing 12 and indicator component 40. As best seen in FIGS. 5 and 6, laminate 62 extends to the edges of inner rings 52 on the ends of fuse casing 12. Laminate 62 is applied such that opening 68 in inner layer 64 is in registry with region 44*a* of electrically conductive layer 44, wherein region 44*a* of electrically conductive layer 44 is visible through the clear, outer layer 66 and opening 68 in inner layer 64. Opening 68 in inner layer 64 defines a cavity or space 72 above region 44*a* of indicator component 40.

Conductive ferrules 82 are attached to the ends of fuse casing 12 to be in electrical contact with metal inner rings 52, and in turn, to be in electrical contact with electrically conductive layer 44 of indicator component 40. In the embodiment shown, ferrules 82 are metallic ferrules that are crimped onto the ends of fuse casing 12 to be in contact with inner rings 52, and further to be in contact with fusible conductor assembly 20 within fuse casing 12. As best seen in FIG. 2, the end of tabs 28 of fusible conductor assembly 20 are bent over metal inner rings 52 prior to attachment of outer conductive ferrules 82.

Fuse 10, as heretofore described, has a first conductive path between conductive ferrules 82. The first conductive path is established through the interior of fuse casing 12 along fusible conductor assembly 20 between conductive ferrules 82.

Fuse 10 also has a second conductive path defined between conductive ferrules 82 along the exterior of fuse casing 12. The second conductive path is comprised of electrically conductive layer 44 of indicator component 40, metallic inner rings 52 and conductive ferrules 82. The first and second conductive paths are electrically parallel to each other.

An arc quenching material 114 is disposed within the cavity of fuse casing 12 and surrounds fusible conductor assembly 20. In a preferred embodiment, arc quenching material 114 is comprised of silica quartz sand.

MANUFACTURE

Figure 12A:
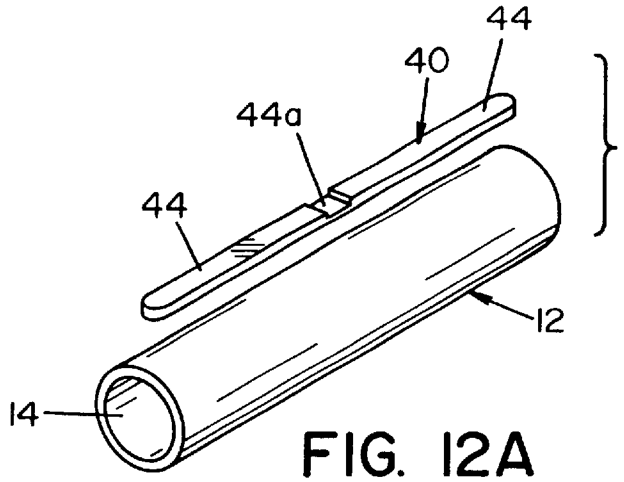
FIG. 12, comprised of FIGS. 12A through 12G, is a perspective view of an evolving fuse through the manufacturing process.
Figure 12B:
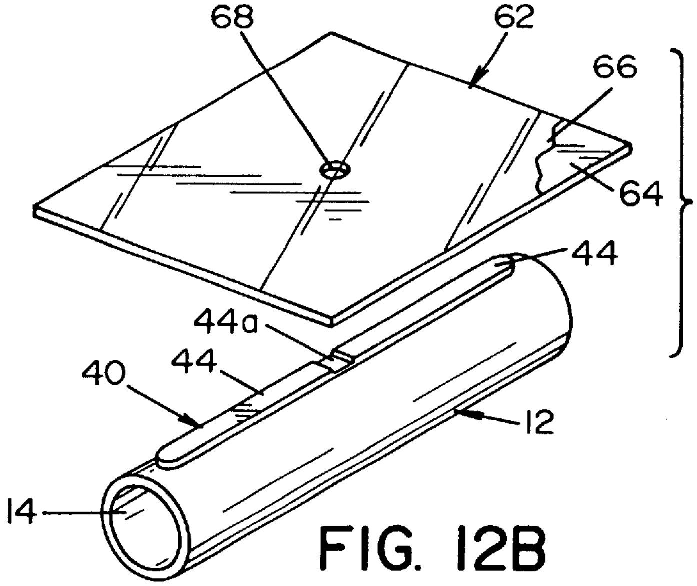
Figure 12C:
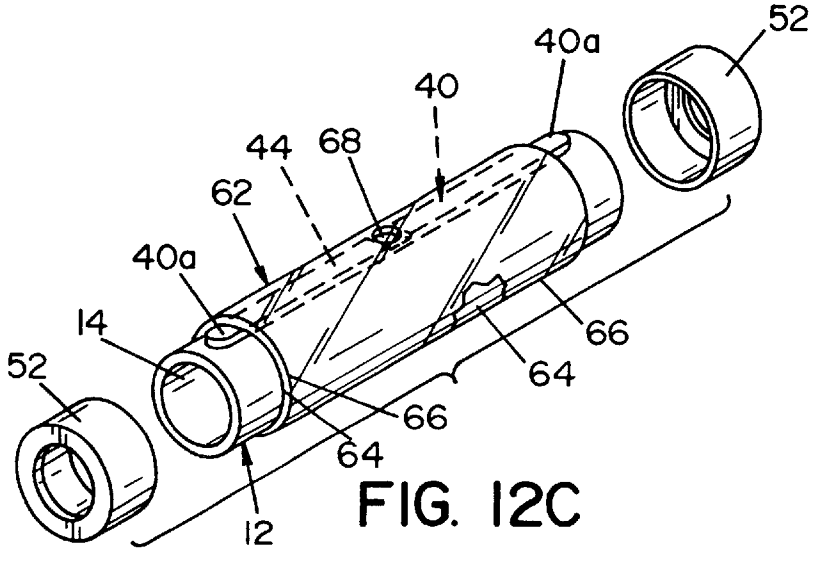

The manufacture of fuse 10 is best illustrated with reference to FIGS. 12A through 12G. Basically, a fuse subassembly 90 (see FIG. 12D) comprised of fuse casing 12, indicator component 40 and laminate 62 is formed. As seen in FIG. 12A, indicator component 40 is mounted along the length of fuse casing 12. Adhesive layer 46 (not shown in FIGS. 12A–12G) secures indicator component 40 in position relative to fuse casing 12. Laminate 62, comprised of inner layer 64 and outer layer 66 that have previously been laminated together, is applied to fuse casing 12. Laminate 62 is positioned such that opening 68 in inner layer 64 is disposed in registry with region 44*a*, i.e., the area of reduced cross-sectional area of electrically conductive layer 44. As seen in FIG. 12C, laminate 62 is dimensioned wherein a portion 40*a* of each end of indicator component 40 is exposed, i.e., not covered by laminate 62. Inner rings 52 are then inserted onto the ends of fuse casing 12 by a crimping, rolling or pressing procedure. As best illustrated in FIGS. 2 and 3, exposed portions 40*a* of electrically conductive layer 44 are in electrically conductive contact with the inner surface of inner rings 52 to complete fuse casing subassembly 90.

Figure 12D:
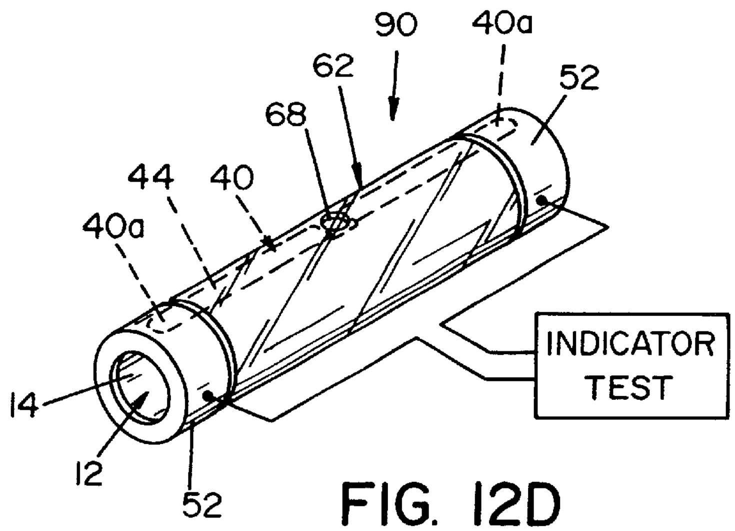
Figure 12E:
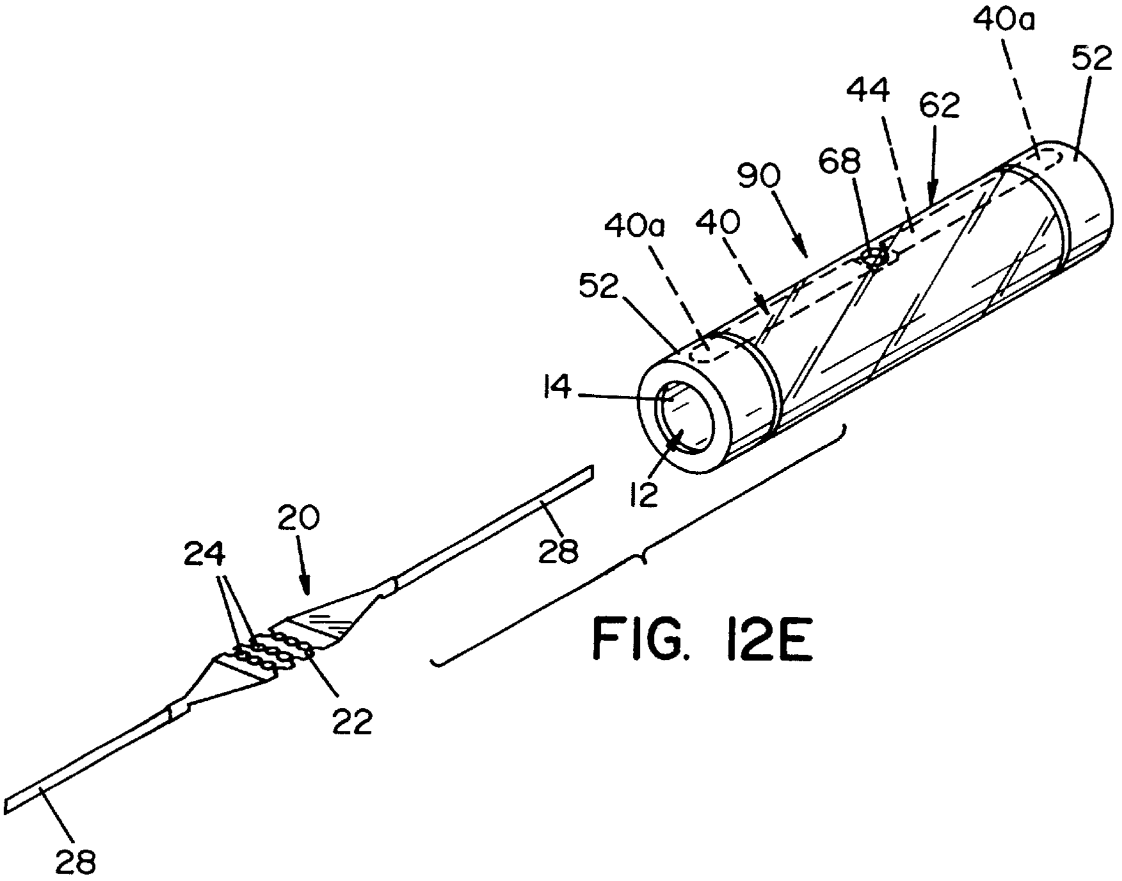

In accordance with the present invention, fuse casing subassembly 90 is then tested, as schematically illustrated in FIG. 12D, by applying a voltage across inner rings 52. Specifically, fuse casing subassembly 90 is tested to insure that a conductive path is formed through electrically conductive layer 44 between metallic inner rings 52, and further to insure that electrically conductive layer 44 of indicator component 40 provides the desired resistivity for the fuse 10 to be formed.

A fusible conductor assembly 20 is then inserted into fuse casing subassembly 90, as shown in FIG. 12D. Fusible conductor assembly 20 may, depending on the type of the fuse, include a trigger/actuator (not shown) and/or a heater assembly (not shown). Basically, any type of conventionally known fusible assembly may find advantageous application with the present invention.

Figure 12F:
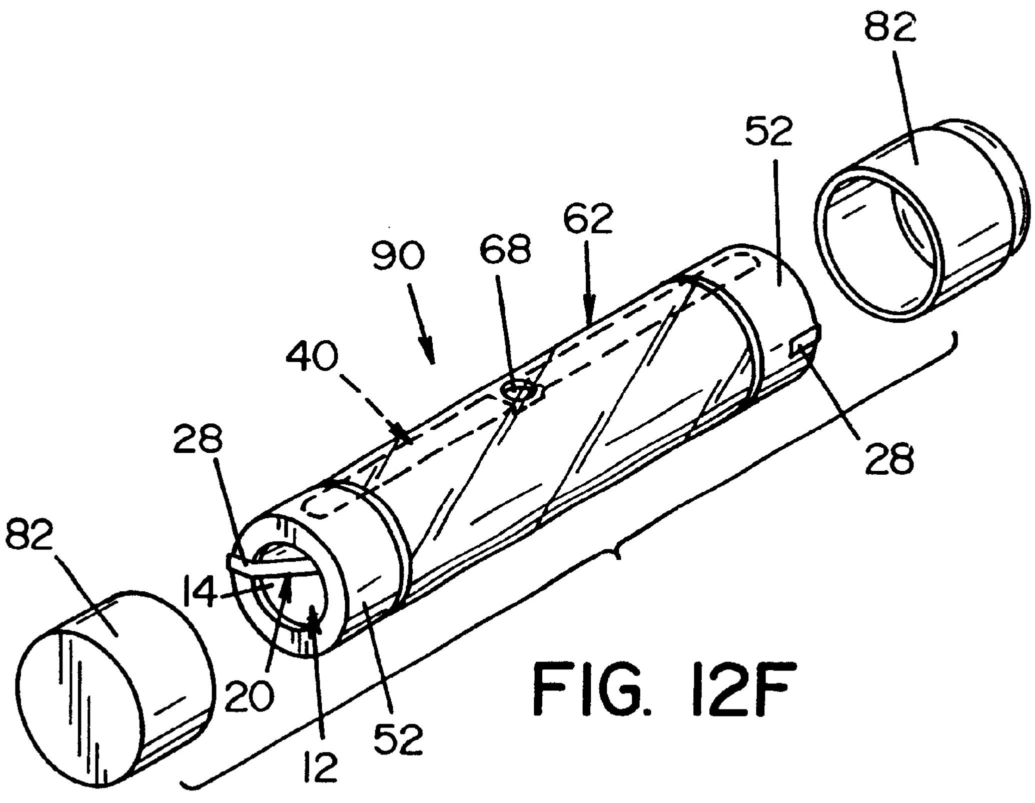
Figure 12G:
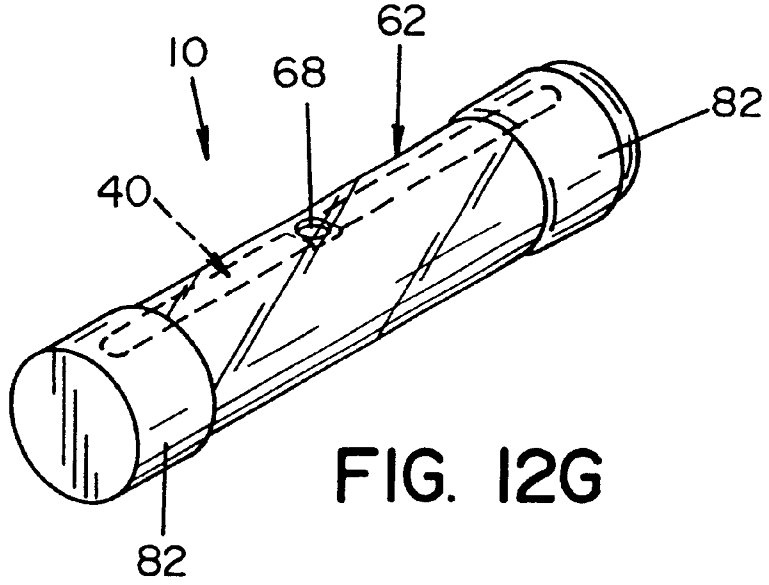

Fusible conductor assembly 20 has end tabs 28 dimensioned to extend beyond the ends of fuse casing 12. The extending portions of tabs 28 are bent over the ends of fuse casing 12 onto metallic inner rings 52, as shown in FIG. 12F. With fusible conductor assembly 20 within fuse casing subassembly 90, a ferrule 82 is crimped onto one end of fuse casing subassembly 90. End ferrule 82 is crimped onto fuse casing 12 of fuse casing subassembly 90 to capture conductive tab 28 of fusible conductor assembly 20 between ferrule 82 and inner ring 52, wherein tab 28 is in conductive contact with metallic inner rings 52 and ferrule 82. With ferrule 82 on one end of fuse casing subassembly 90, arc quenching material 114 is then introduced into cavity 14 defined fuse casing 12 to fill same. A second ferrule 82 is then attached to the other end of fuse casing subassembly 90, in a similar manner as previously described, to capture tab 28 of fusible conductor assembly 20 against metallic inner rings 52. As shown in the drawings, conductive end ferrules 82 are preferably dimensioned also to capture a portion of laminate 62 thereby totally encasing indicator component 40 beneath laminate 62 and beneath end ferrules 82.

OPERATION

Fuse 10 is adapted to open if subjected to an excessive short circuit condition, or if subjected to a moderate overload for a sustained period of time, and to provide an indication if fuse 10 is open as a result of either condition. In accordance with the present invention, the electrical resistance of indicator component 40 is established such that it has a higher electrical resistance than fusible conductor assembly 20. As indicated above, the ability to test each indicator component 40 on fuse casing 12 insures that the proper resistance exists along the second conductive path through indicator component 40. During normal operation, current will flow along the first conductive path, i.e., through fusible conductor assembly 20 within fuse casing 12.

Figure 8:
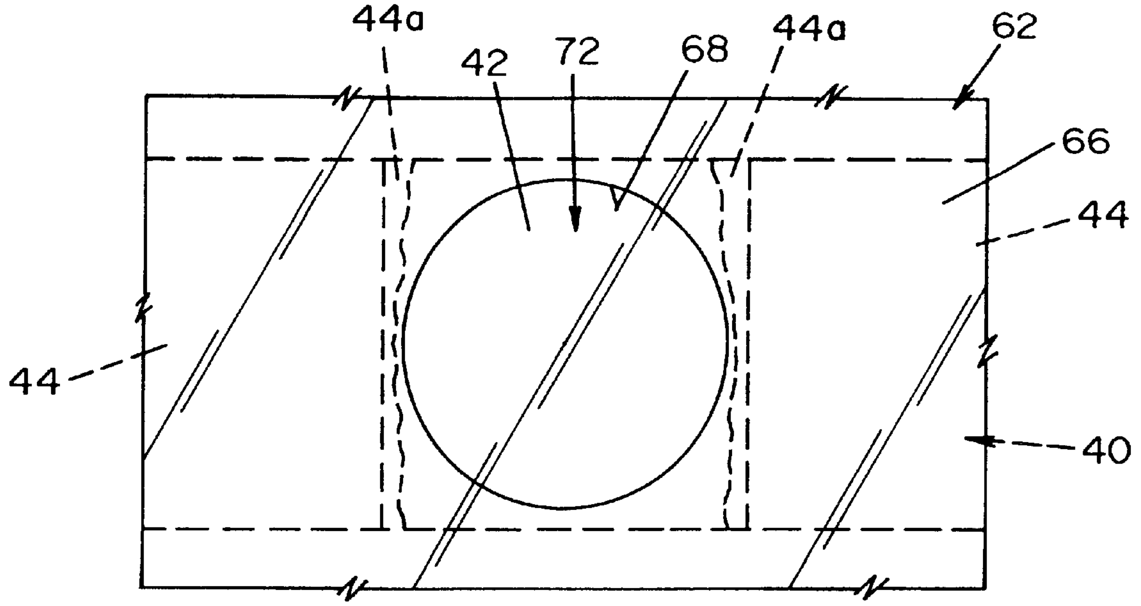
FIG. 8 is an enlarged, top plan view of the indicator, showing the indicator after a first type of fault condition.

Referring to the operation of fuse 10, under a short circuit condition, i.e., when current in excess of ten times the nominal rated current of fuse 10 passes through fuse 10 longer than 1–2 milliseconds, the fusible element of fusible conductor assembly 20 ionizes and forms an interrupt arc. At higher currents, the fusible element of fusible conductor assembly 20 ionizes sooner. The interrupt arc is quenched within fuse casing 12 by arc quenching material 114. With current through fusible conductor assembly 20 terminated, the current is then directed to electrically conductive layer 44 of indicator component 40. The dimensions of electrically conductive layer 44 are such that it cannot withstand the high current levels imposed on it during a short circuit fault condition. As a result, electrically conductive layer 44 of indicator component 40 will vaporize. Since region 44*a*, of reduced cross-sectional area, has the highest resistance, vaporization and arcing will occur at this location. In accordance with the present invention, cavity or space 72 above region 44*a*, facilitates the arcing and vaporization of electrically conductive layer 44, without burning the polymeric materials of laminate 62 which would occur in absence of the air within space or cavity 72. The vaporization of electrically conductive layer 44 in region 44a of reduced cross-sectional area exposes deep-dyed indicator layer 42. Exposure of indicator layer 42 thus provides an indication of the open circuit through fuse casing 12. Basically, the window defined by laminate 62 changes from a silvery state, existing when the aluminum metal layer is still present, to a red color when the aluminum metal has vaporized exposing the underlying deep-dyed Mylar® indicator layer 42. Typically, a short circuit condition will vaporize a significant portion of electrically conductive layer 44, as schematically illustrated in FIG. 8, and will expose all of indicator layer 42 within opening 68, wherein a full, dye-colored dot is visible through opening 68 in laminate 62.

Figure 8A:
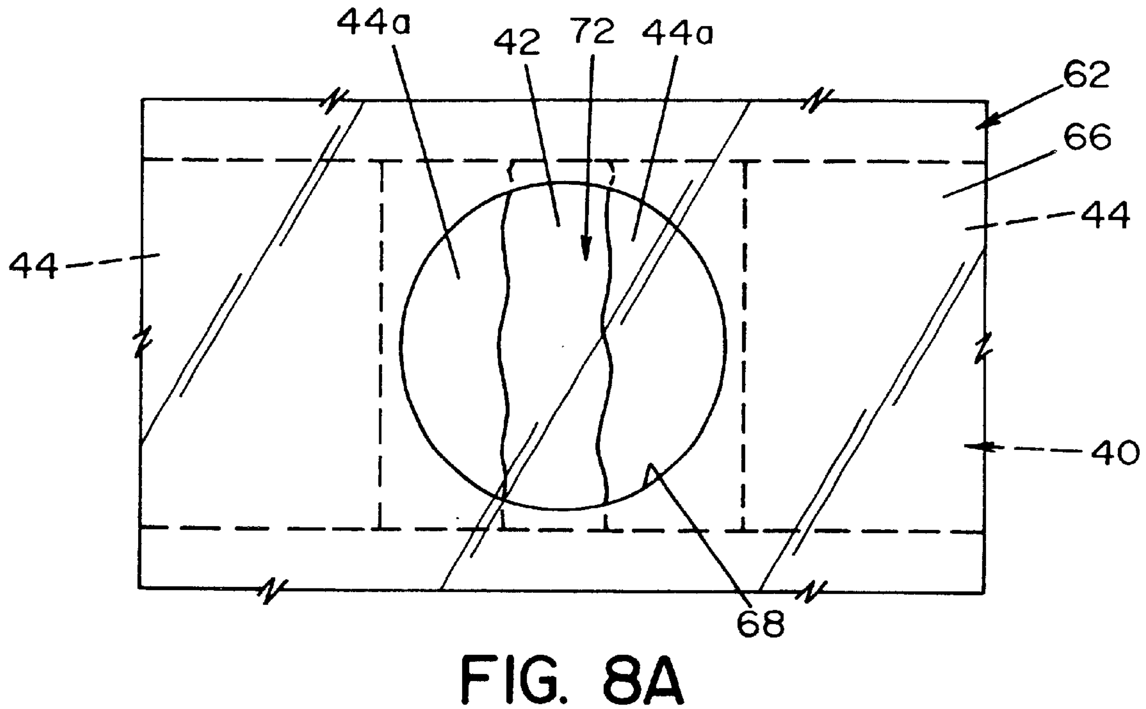
FIG. 8A is an enlarged, top plan view of the indicator, showing the indicator after a second type of fault condition.

Referring to an over current fault condition, at low overload conditions, for example, two times the rated current, fusible conductor assembly 20 will typically not ionize. Rather, a heating element (not shown) and a portion of a trigger/actuator assembly (not shown) will heat up. Such heat will be conducted to a temperature-sensitive material. When the temperature-sensitive material reaches its melting or softening point, conductive elements within the fusible circuit assembly will separate, thereby forming an open circuit. With fusible conductor assembly 20 no longer conducting current along the first current path, the current is transferred to electrically conductive layer 44. Although the current level is lower than the short circuit condition previously described, electrically conductive layer 44 of indicator component 40 still cannot withstand the current, and the vapor deposited aluminum forming electrically conductive layer 44 will ionize. Unlike a short circuit condition where excessive levels of current are impressed on the aluminum, the current impressed upon electrically conductive layer 44, under an over current fault condition, the current is still sufficient to vaporize electrically conductive layer 44 in the region of reduced cross-sectional area, but not so high as to vaporize the entire region 44*a* beneath cavity 72 defined by opening 68. As a result, rather than exposing the entire indicator layer 42 within opening 68, only a portion of indicator layer 42 is exposed. In other words, rather than a full dot of the dyed polymer being visible in opening 68, a limited, line-like portion of indicator layer 42 is exposed, as schematically illustrated in FIG. 8A.

An indicator according to the present invention can provide a different visual indication of a blown fuse based upon the magnitude of the current density (J) and the voltage (V) that was applied to conductive layer 44. In this respect, current density (J) is expressed as:

$$J=I/A,$$

where "A" is the cross-sectional area of the metal that forms conductive layer 44 and "I" is the current that is applied to conductive layer 44.

Above a critical current density ($J_{critical}$) the metal of conductive layer 44 will disintegrate. The extent of the disintegration of conductive layer 44 is related to the amount that the current density (J) applied to conductive layer 44 exceeds the critical current density ($J_{critical}$). Stated another way, the level of disintegration of conductive layer 44 will vary depending upon how much the current density (J) applied to conductive layer 44 exceeds the critical current density ($J_{critical}$) for that conductive layer 44.

Another factor that affects the disintegration of conductive layer 44 is the voltage ($V_{critical}$) needed to produce the critical current density ($J_{critical}$). In this respect, $$V_{critical}=J_{critical}\cdot\rho\cdot L,$$

where "ρ" is the resistivity of the metal that forms conductive layer 44, and "L" is the length of conductive layer 44. As will be appreciated, varying the dimensions and composition of conductive layer 44 will vary "ρ" and "L," thus changing $V_{critical}$ and $J_{critical}$. Accordingly, indicators responsive to various operating conditions may be designed by varying the composition and shape of conductive layer 44.

The foregoing description describes specific embodiments of the present invention. Numerous alterations and modifications will occur to those skilled in the art.

Figure 13:
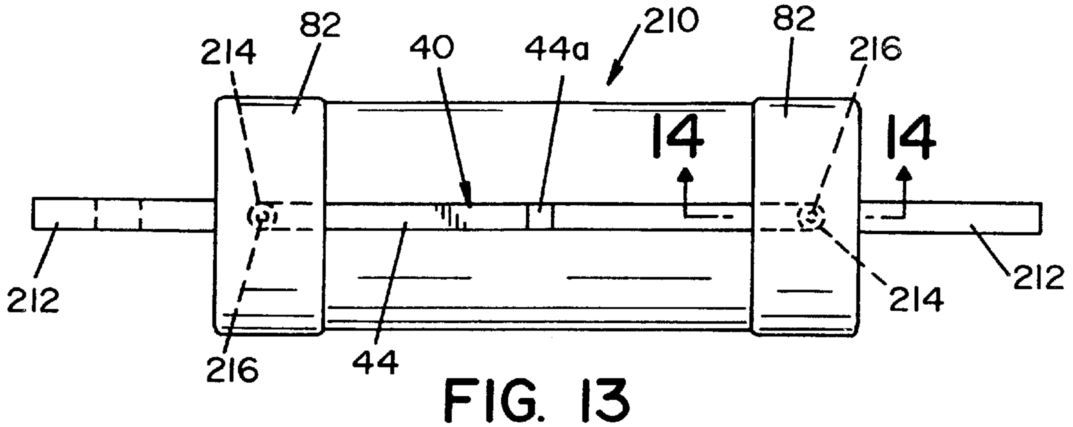
FIG. 13 is a side view of an electric type fuse illustrating an alternate embodiment of the present invention.
Figure 14:
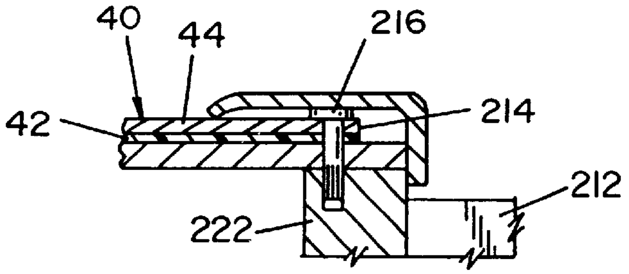
FIG. 14 is an enlarged, sectional view taken along lines 14—14 of FIG. 13.
Figure 15:
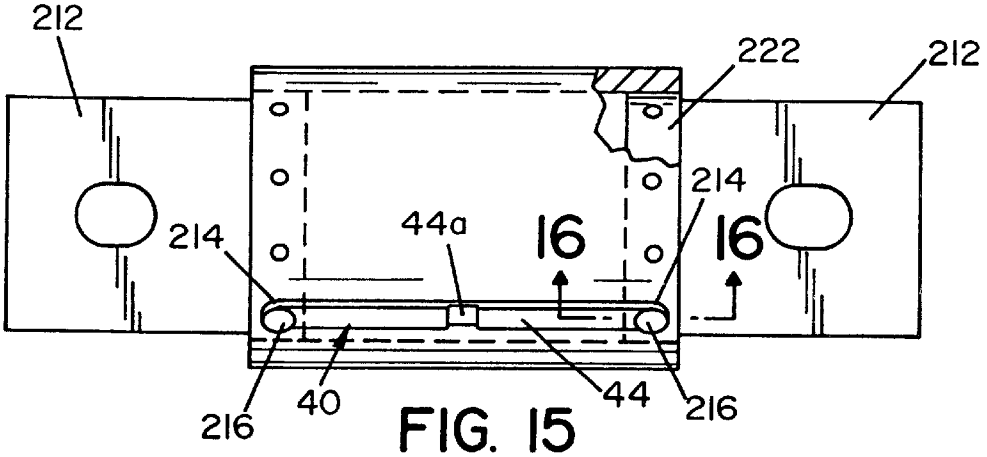
FIG. 15 is a side view of an electric type fuse illustrating a preferred embodiment of the present invention.
Figure 16:
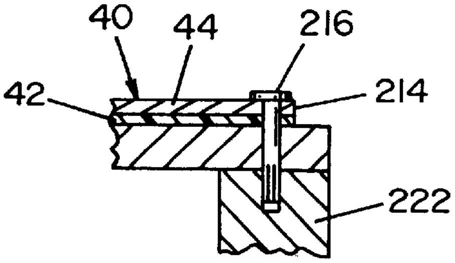
FIG. 16 is an enlarged, sectional view taken along lines 16—16 of FIG. 15.

Referring now to FIGS. 13 through 16, alternate embodiments of the present invention are shown. Specifically, FIGS. 13 and 14 show an indicator component 40, in accordance with the present invention, used in fuse 210 having blade contacts 212, as contrasted to end ferrules 82, shown in FIGS. 1 through 12. In this respect, unlike the embodiment shown in FIGS. 1 through 12, wherein electrically conductive layer 44 of indicator component 40 comes in contact with conductive end ferrules 82 through metallic inner rings 52, eyelets 214 and pins 216 extending through the ends of indicator component 40 are provided in fuse 210 to form a current path through indicator component 40 to internal metal blocks 222 that are attached to conductive blade contacts 212. The embodiments shown in FIGS. 13 through 16 show how an indicator component 40 according to the present invention finds advantageous application with other types of fuses. it is intended that all such modifications and alterations be included insofar as they come within the scope of the invention as claimed or the equivalents thereof.

Having described the invention, the following is claimed:

1. An electric fuse, comprised of:

a tubular fuse casing formed of an electrically insulating material;

a first conductive component attached to a first end of said casing;

a second conductive component attached to a second end of said casing;

a first conductive path extending through said tube between said first and second conductive components, said first conductive path including a fusible element and having a first resistance; and a second conductive path extending along the exterior of said tubular fuse casing, said second conductive path being in parallel to said first conductive path, having a second resistance greater than said first resistance and including an indicator component, said indicator component, comprised of:

a first layer providing a visual indication of color;

a second layer including at least one metal layer on said first layer, said second layer having a region of increased resistance;

a cavity located above said region of increased resistance; and a third layer comprised of a transparent polymeric material covering said cavity and said first and second layers.

2. An electric fuse as defined in claim 1, wherein said first layer and said second layer of said indicator are elongated strips that extend along said tubular fuse casing, with said second layer being electrically connected to said first and second conductive components.

3. An electric fuse as defined in claim 2, wherein said third layer is dimensioned to wrap around said tubular fuse casing.

4. An electric fuse as defined in claim 3, wherein said second layer includes at least one metal layer that is vapor deposited on said first layer.

5. An electric fuse as defined in claim 4, wherein said region of increased resistance is formed by a reduction in the cross-sectional area of said second layer.

6. An electric fuse as defined in claim 5, wherein said region of increased resistance is comprised of an area of reduced thickness.

7. An electric fuse as defined in claim 6, wherein said cavity above said region of increased resistance is defined by said area of reduced thickness.

8. An electric fuse as defined in claim 5 further comprising a fourth layer of a polymeric material disposed between said second layer and said third layer, said fourth layer having an opening therethrough in registry with said region of increased resistance of said second layer, wherein said opening in said fourth layer forms said cavity.

9. An electric fuse as defined in claim 8, wherein an adhesive secures said first layer to said tubular fuse casing.

10. An electric fuse, comprised of:

a tubular fuse casing formed of an electrically insulating material;

a first conductive component attached to a first end of said casing;

a second conductive component attached to a second end of said casing;

a first conductive path extending through said tube between said first and second conductive components, said first conductive path including a fusible element and having a first resistance;

an indicator strip extending along the length of said tubular fuse casing, said indicator strip comprised of a first indicator layer having a conductive layer of metal thereon, said conductive layer being electrically connected to said first and said second conductive components to be in parallel with said first conductive path, said conductive layer having a second resistance greater than said first resistance and having a region of increased resistance wherein the resistance of said region is greater than said second resistance;

a cover layer of polymeric material covering said indicator strip, said cover layer being clear in the vicinity of said region, wherein said region is visible through said cover layer; and a cavity formed between said cover layer and said metal layer, said cavity disposed contiguous to said region and being dimensioned to promote vaporization of said metal at said region to expose said indicator layer when a fault condition exists along said first conductive path.

11. An electric fuse as defined in claim 10, wherein said cavity is formed by a recess in said metal layer.

12. An electric fuse as defined in claim 10, wherein an intermediate layer of polymer is disposed between said cover layer and said metal layer, said intermediate layer having an opening therein, said opening being in registry with said region of reduced increased resistance area in said metal layer, wherein said cavity is defined by said opening.

13. An electric fuse as defined in claim 12, wherein said region of increased resistance is defined by an area of reduced cross-sectional area in said conductive layer.

14. An electric fuse, comprised of:

a tubular casing formed of an electrically insulating material;

a first conductive component attached to a first end of said casing;

a second conductive component attached to a second end of said casing;

a fusible element within said casing electrically connected to said first and second conductive components, said first fusible element having a first resistance;

an indicator on said casing, said indicator, comprised of:

a first layer comprised of a non-flammable, dyed material; and a second layer comprised of a conductive material deposited on said first layer, said second layer having an area of reduced thickness and a predetermined resistance greater than the resistance of said fusible element, said indicator mounted to said casing with said second layer electrically connected to said first and second conductive elements in parallel with said fusible element and with said first layer of dyed material between said second layer and said casing; and a third layer of a clear, polymeric material covering said indicator and at least a portion of said casing wherein said area of reduced thickness of said second layer is visible through said third layer;

said second layer of conductive material dimensioned to vaporize and expose a portion of said first layer when said fusible element experiences a fault condition that eliminates the electrical connection between said first and second conductive elements, said indicator providing a first visual indication when said fault condition results from a short circuit and a second visual indication when said fault condition results from an over current fault condition.

15. An electric fuse as defined in claim 14, wherein said first visual indication is a first area of said first layer being exposed, and said second visual indication is a second area of said first layer being exposed, said second area being noticeably smaller than said first area.

* * * * *

US006456189C1

(12) EX PARTE REEXAMINATION CERTIFICATE (8243rd)

United States Patent

Mosesian et al.

(10) Number: US 6,456,189 C1

(45) Certificate Issued: May 17, 2011

(54) ELECTRICAL FUSE WITH INDICATOR

(75) Inventors: Jerry L. Mosesian, Newburyport, MA (US); Robert Wilkins, Wirral Mersey Side (GB)

(73) Assignee: Ferraz Shawmut S.A., Lyons (FR)

Reexamination Request:
No. 90/011,057, Jun. 22, 2010

Reexamination Certificate for:

| | |
|---|---|
| Patent No.: | **6,456,189** |
| Issued: | **Sep. 24, 2002** |
| Appl. No.: | **09/724,154** |
| Filed: | **Nov. 28, 2000** |

(51) Int. Cl.

| | |
|---|---|
| ***H01H 85/30*** | (2006.01) |
| ***G01R 31/07*** | (2006.01) |

(52) U.S. Cl. ........................ 337/243; 337/241; 337/265; 337/266; 337/206; 324/550; 116/207

(58) Field of Classification Search ........................ None

See application file for complete search history.

(56) References Cited

FOREIGN PATENT DOCUMENTS

GB 1093482 12/1967

*Primary Examiner*—My-Trang Nu Ton

(57) ABSTRACT

An electric fuse is comprised of a tubular fuse casing formed of an electrically insulating material. A first conductive component is attached to a first end of the casing and a second conductive component is attached to a second end of the casing. A first conductive path is formed through the tube between the first and second conductive components. The conductive path includes a fusible element having a first resistance. A second conductive path is formed along the exterior of the tubular fuse casing. The second conductive path is in parallel to the first conductive path and has a second resistance greater than the first resistance. The second conductive path includes an indicator component. The indicator component is comprised of first layer comprised of a colored material, and a second layer comprised of an electrically conductive material deposited onto the first layer. The second layer has a region of increased resistance. An inner cavity is located above the region of increased resistance on the second layer.A third layer comprised of a transparent, polymeric material covers the cavity and the first and second layers.

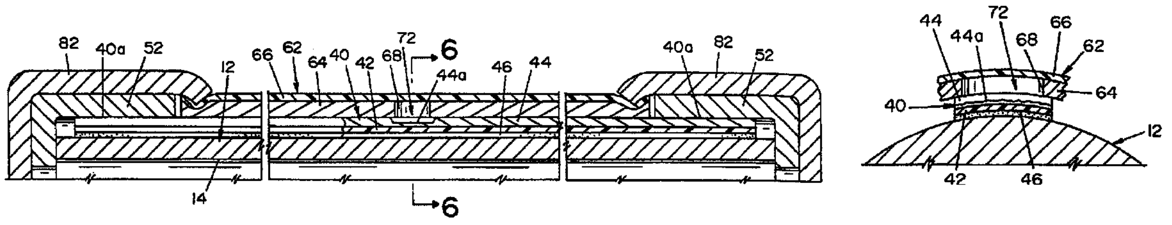

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 10-15 is confirmed.

Claim 1 is determined to be patentable as amended.

Claims 2-9, dependent on an amended claim, are determined to be patentable.

New claims 16-18 are added and determined to be patentable.

1. An electric fuse, comprised of:

a tubular fuse casing formed of an electrically insulating material;

a conductive component attached to a first end of said casing;

a second conductive component attached to a second end of said casing;

a first conductive path extending through said tube between said first and second conductive components, said first conductive path including a fusible element and having a first resistance; and a second conductive path extending along the exterior of said tubular fuse casing, said second conductive path being in parallel to said first conductive path, having a second resistance greater than said first resistance and including an indicator component, said indicator component, comprised of:

a first *nonconductive* layer providing a visual indication of color;

a second layer including at least one metal layer on said first layer, said second layer having a region of *reduced cross-section to provide a region of* increased resistance;

a cavity located above said region of increased resistance; and a third layer comprised of a transparent polymeric material covering said cavity and said first and second layers.

*16. The electric fuse of claim 1 wherein*

*a multilayer composite sheet covers the second conductive layer that is disposed over the colored nonconductive layer,*

*the second conductive layer having a region of reduced thickness to produce a region of increased resistance,*

*the multilayer composite sheet containing an aperture in its central region, and wherein*

*the multilayer composite sheet surrounds the cylindrical casing with its aperture in registry with the region of reduced thickness in the conductive layer.*

*17. The electric fuse of claim 16 wherein*

*the multilayer composite sheet extends along the major portion of the length of the cylindrical casing.*

*18. The electric fuse of claim 16 wherein*

*the region of reduced thickness in the conductive layer becomes vaporized when a high current passes through the elongated conductor to thereby expose the colored layer to indicate the occurrence of the high current condition.*

* * * * *